(12) United States Patent
Ng et al.

(10) Patent No.: US 9,209,373 B2
(45) Date of Patent: Dec. 8, 2015

(54) HIGH POWER PLASTIC LEADED CHIP CARRIER WITH INTEGRATED METAL REFLECTOR CUP AND DIRECT HEAT SINK

(75) Inventors: Keat Chuan Ng, Penang (MY); Kheng Leng Tan, Gelugor (MY); Chaiu Jin Lee, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 126 days.

(21) Appl. No.: 13/033,520

(22) Filed: Feb. 23, 2011

(65) Prior Publication Data
US 2012/0211785 A1    Aug. 23, 2012

(51) Int. Cl.
| | | |
|---|---|---|
| *H01L 29/73* | (2006.01) | |
| *H01L 33/64* | (2010.01) | |
| *H01L 33/48* | (2010.01) | |
| H01L 33/60 | (2010.01) | |
| H01L 23/495 | (2006.01) | |

(52) U.S. Cl.
CPC ............ *H01L 33/647* (2013.01); *H01L 33/486* (2013.01); *H01L 23/49562* (2013.01); *H01L 33/60* (2013.01); *H01L 33/642* (2013.01); *H01L 2224/48465* (2013.01); *H01L 2933/0075* (2013.01)

(58) Field of Classification Search
CPC ................ H01L 33/647; H01L 33/486; H01L 23/49562; H01L 33/60; H01L 33/642; H01L 2224/48465; H01L 2933/0075
USPC ....... 362/311.02, 800; 257/98, 100, E33.056, 257/E33.072
See application file for complete search history.

(56) References Cited

U.S. PATENT DOCUMENTS

| | | | | |
|---|---|---|---|---|
| 3,716,759 | A * | 2/1973 | Scace et al. | 361/704 |
| 6,657,382 | B2 * | 12/2003 | Nagai et al. | 313/512 |
| 6,992,386 | B2 * | 1/2006 | Hata et al. | 257/735 |
| 7,499,288 | B2 * | 3/2009 | Tanaka et al. | 361/767 |
| 7,775,685 | B2 * | 8/2010 | Loh | 362/311.02 |
| 8,093,078 | B2 * | 1/2012 | Kuo et al. | 438/27 |
| 2010/0044726 | A1 | 2/2010 | Li et al. | |
| 2010/0264437 | A1 | 10/2010 | Loo et al. | |
| 2010/0270577 | A1 | 10/2010 | Rulkens et al. | |
| 2012/0080701 | A1 * | 4/2012 | Kim et al. | 257/98 |

FOREIGN PATENT DOCUMENTS

WO    WO2009131213    * 10/2009

OTHER PUBLICATIONS

Greenzm, "LED package in various forms of structure and technology", available at http://greensm.cn/_d269150506.htm, Zhuhai Green Lighting Technology Co., Ltd., Zhuhai City, China, printed on Feb. 23, 2011, 3 pages.
SZ LCCL Opto-Electronic Science & Technology Co. Ltd, "LED structure and the multiple forms Packaging Technology", available at http://www.szlccl.com/english/NewsView.asp?ID=129 &SortID=19, Shenzhen Lianchuang Cailiang Photoelectric technology companies, Nov. 19, 2007, 3 pages.

* cited by examiner

*Primary Examiner* — Michael Shingleton
(74) *Attorney, Agent, or Firm* — Fox Rothschild LLP

(57) ABSTRACT

A Plastic Leaded Chip Carrier (PLCC) package is disclosed. The PLCC package includes a lead frame with an integrated reflector cup. The reflector cup is directly connected to a heat sink, which improves the ability of the PLCC package to distribute heat away from the light source that is provided in the reflector cup.

20 Claims, 10 Drawing Sheets

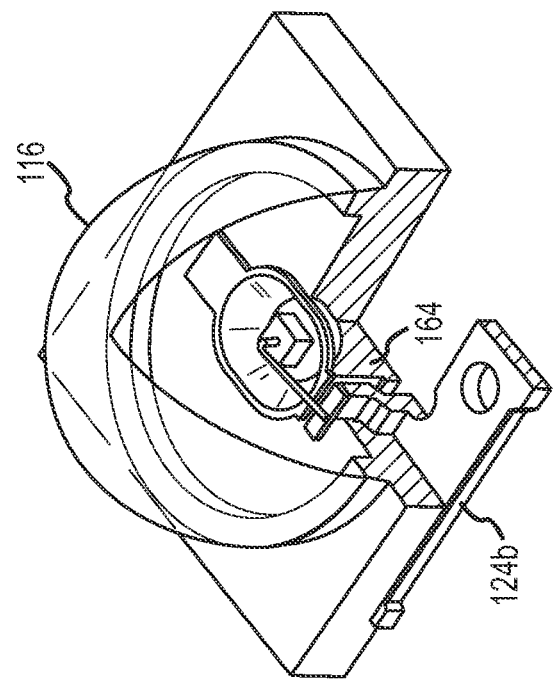
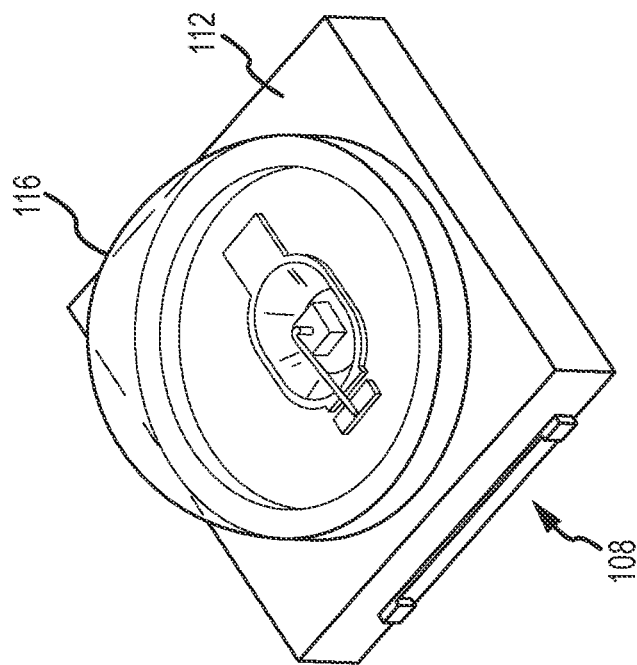

HIGH POWER PLASTIC LEADED CHIP CARRIER WITH INTEGRATED METAL REFLECTOR CUP AND DIRECT HEAT SINK

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Among the various packages for LEDs, an LED package of interest is the Plastic Leaded Chip Carrier (PLCC) package for a surface mount LED. Surface mount LEDs in PLCC packages may be used, for example, in automotive interior display devices, electronic signs and signals, and electrical equipment.

To increase the capacity of an LED package to dissipate more heat, various designs are used in the industry; however, each of these designs results in LED packages with limited heat dissipation capacities which simultaneously increase the complexity and the costs associated with manufacturing the LED packages.

For example, some LED package designs utilize a large heat sink slug that is distinct from the lead frame. The heat sink slug increases the capacity of the LED package to dissipate heat; however, because the heat sink slug is a separate component, the costs associated with manufacturing LED packages according to this design are relatively difficult and more costly, particularly because the number of manufacturing steps are increased due to the need to assembly the multiple pieces together. Furthermore, LED packages which incorporate a separate heat sink slug are larger in size due to the increased number of components in the LED package. Another shortcoming is that because a large LED package is required to accommodate the separate heat sink slug, a larger lens is also required to fit onto the larger LED package. All of this increases the cost of the LED package.

BRIEF DESCRIPTION OF THE DRAWINGS

The present disclosure is described in conjunction with the appended figures:

FIG. 3A is a top perspective view of a first PLCC package in accordance with embodiments of the present disclosure;

FIG. 3B is a cut-away perspective view of the PLCC package depicted in FIG. 3A;

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although one particular type of PLCC package is depicted and described, embodiments of the present disclosure are not so limited. In particular, embodiments of the present disclosure can be utilized in any type of known PLCC package and/or platform. Specifically, any type of PLCC package and/or platform or similar type of package for a light emitting device that uses a plastic molded lead frame can incorporate one or more features disclosed herein.

Figure 1A:
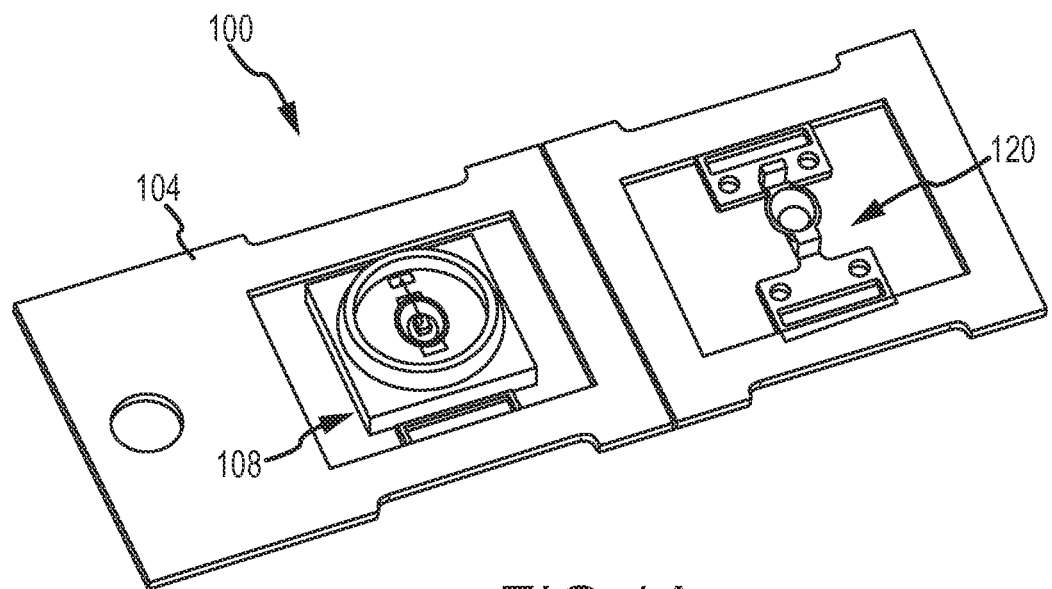
FIG. 1A is a top perspective view of a first package assembly in accordance with embodiments of the present disclosure.

With reference now to FIGS. 1A-3C, a first package assembly 100 comprising a first package carrier 104 used to create a first PLCC package 108 will be described in accordance with at least some embodiments of the present disclosure. The PLCC package 108 comprises a plastic housing 112 molded around a lead frame 120. As can be seen in FIGS. 1A and 1B, the lead frame 120 may be carried by the package carrier 104. In some embodiments, the package carrier 104 comprises a plurality of lead frames 120. Thus, batch manufacturing techniques can be employed to manufacture a plurality of PLCC packages 108 on a single package carrier 104.

In some embodiments, the lead frame 120 is initially an integral part of the package carrier 104. In particular, the package carrier 104 may comprise a sheet of metal or similar conductive material having one or more raised portions. The lead frame 120 may be constructed by removing certain portions of the package carrier 104. As one example, the lead frame 120 may be formed by stamping the package carrier 104 and removing excess portions therefrom. Other manufacturing techniques such as machining, etching, and the like may additionally or alternatively be used to construct the lead frame.

Figure 1B:
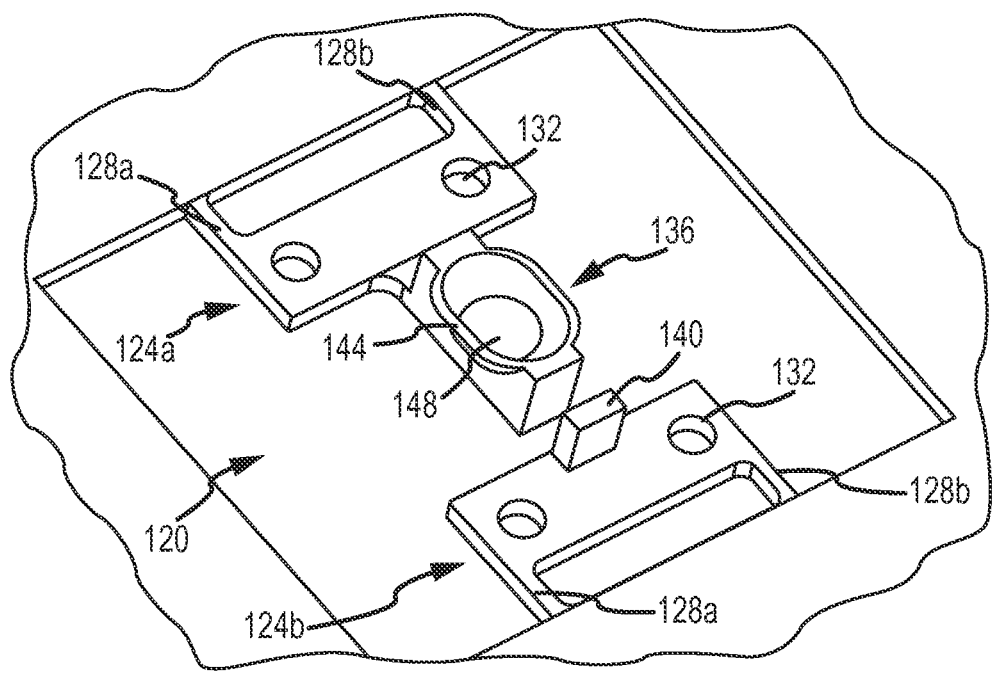
FIG. 1B is a top perspective view of a first lead frame in accordance with embodiments of the present disclosure.

With reference now to FIG. 1B, further details of the lead frame 120 will be described in accordance with at least some embodiments of the present disclosure. Some or all of the features of the lead frame 120 may be created in a single manufacturing step (e.g., a single stamping step) or in multiple manufacturing steps (e.g., a stamping step followed by a machining or etching step).

In some embodiments, the lead frame 120 comprises a first lead 124a and a second lead 124b. Although the lead frame 120 is depicted as having only two leads 124a, 124b, a greater or lesser number of leads may be included in the lead frame 120 without departing from the scope of the present disclosure.

A gap may be provided between the first lead 124a and second lead 124b. The gap ensures that an electrical potential can be applied between the first lead 124a and second lead 124b. The electrical potential eventually applied between the first lead 124a and second lead 124b may be used to power a light source packaged within the PLCC package 108.

During at least some of the manufacturing process, the first lead 124a and second lead 124b are connected to the package carrier 104 via one or more connectors 128a, 128b. Although each lead 124a, 124b is depicted as having two connectors 128a, 128b associated therewith, a greater or lesser number of connectors may be provided for each of the leads without departing from the scope of the present disclosure. The connectors 128a, 128b of each lead 124a, 124b provide a mechanism which secures the leads 124a, 124b to the package carrier 104 and maintain a specific relative position between the leads 124a, 124b until a plastic housing 112 is formed around the lead frame 120. After the manufacturing process has been completed, the relative position of the leads 124a, 124b are fixed and the connectors 128a, 128b can be severed, thereby separating the PLCC package 108 from the package carrier 104. In some embodiments, the connectors 128a, 128b are provided as thin strips of metal which connect the outer edges of each lead 124a, 124b to the rest of the package carrier 104. As can be appreciated, additional connectors can be provided between the outer edges of the lead to ensure a more secure connection between the lead frame 120 and package carrier 104 during the manufacturing process.

Another feature which may be formed in the lead frame 120 during a stamping process, for example, is one or more anchorage holes 132. The anchorage holes 132 may correspond to vias or cavities which provide an anchor point between the plastic housing 112 and lead frame 120. More specifically, when the plastic housing 112 is formed around the lead frame 120, plastic from the plastic housing 112 may fill some or all of the anchorage holes 132, thereby creating a more secure connection between the lead frame 120 and plastic housing 112. Similar to the connectors 128a, 128b, although each lead 124a, 124b is depicted as having two anchorage holes 132, a greater or lesser number of anchorage holes 132 may be provided in a lead without departing from the scope of the present disclosure.

Yet another feature which may be formed in the lead frame 120 is a lead frame cavity 144. The lead frame cavity 144 may be an integral portion of the lead frame 120, meaning that the lead frame cavity 144 is directly connected to one of the leads 124a, 124b of the lead frame 120. In the embodiment depicted in FIG. 1B, the lead frame cavity 144 is directly connected to the first lead 124a. In some embodiments, the lead frame cavity 144 may be provided on a first raised portion 136 of the first lead 124a. A corresponding second raised portion 140 may be provided on the second lead 124b.

Figure 2B:
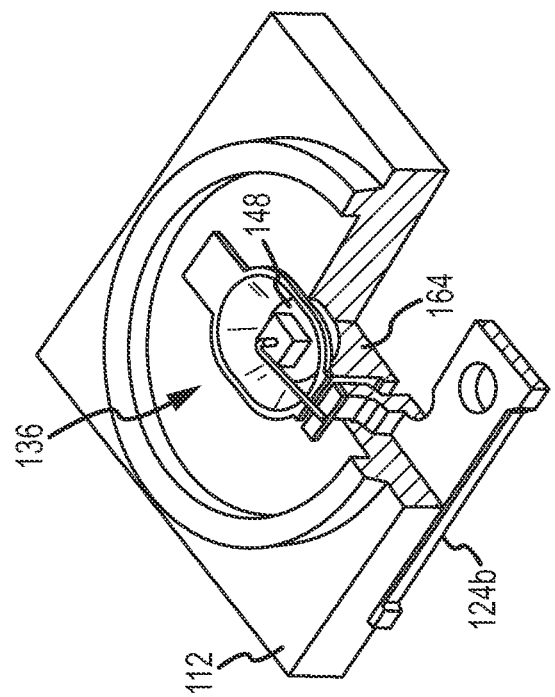
FIG. 2B is a cut-away perspective view of the partially-completed PLCC package depicted in FIG. 2A.
Figure 2A:
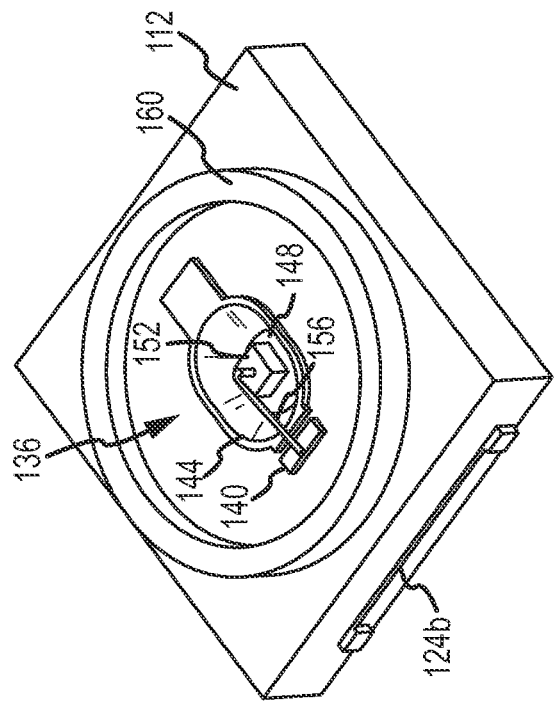
FIG. 2A is a top perspective view of a first partially-completed PLCC package in accordance with embodiments of the present disclosure.

In some embodiments, the top of the first raised portion 136 is approximately the same height as the top of the second raised portion 140. The lead frame cavity 144 may be formed as a reflective cup that has been stamped into the first raised portion 136. As can be seen in FIGS. 2A and 2B, the bottom surface of the lead frame cavity 144 may correspond to a bonding pad 148, which is configured to receive a light source 152. The reflective cup of the lead frame cavity 144 may comprise an upper ridge that has a larger area than the bonding pad 148.

The walls of the reflective cup between the upper ridge and the bonding pad 148 may be configured to reflect light emitted by the light source 152, thereby increasing the efficiency with which the PLCC package 108 emits light. In some embodiments, the package carrier 104 and, therefore, the lead frame 120 is constructed of a metal or similar material that has a sufficient reflectance. In other embodiments, the walls of the reflective cup are plated with a reflective material to enhance the reflectance of the reflective cup. If the walls of the reflective cup are plated with a material that is different from the material used to construct the lead frame 120, any known plating or material deposition technique may be employed. For instance, electroless or electro-plating techniques may be employed to deposit a highly-reflective material (e.g., Al, Au, Ag, Ni, W, Pi, and/or Pt) onto the walls of the reflective cup.

As can be seen in FIGS. 1B, 2B, and 3B, the first raised portion 136 may be connected to the non-raised portion of the first lead 124a via an integral heat sink 164. In some embodiments, the heat sink 164 is an integral part of the first lead 124a. In other words, the heat sink 164, the lead frame cavity 144, and all other parts of the first lead 124a are formed of a single piece of material. By providing an integral heat sink 164 between the lead frame cavity 144 and the lower portions of the first lead 124a, a heat sink 164 can be included in the lead frame 120, thereby reducing the number of components required to achieve a PLCC package 108 that is efficient at dissipating heat produced by the light source 152. The integral heat sink 164 is dual-purposed to transfer heat away from the light source 152 while simultaneously carrying current to/from the light source 152.

The light source 152, in some embodiments, comprises an LED or array of LEDs. Where an LED or similar light source is used, a bonding wire 156 may be used to connect a top surface of the light source 152 to the second raised portion 140 of the second lead 128b while the bottom surface of the light source 152 is electrically connected to the first lead 124a via the bonding pad 148. In such a configuration, one surface of the light source 152 may correspond to an anode of the light source 152 and another surface of the light source 152 may correspond to a cathode of the light source 152. By connecting the light source 152 to two different leads 124a, 124b an electrical potential can be applied to the anode and cathode of the light source 152 thereby energizing the light source 152 and causing it to emit light. In some embodiments, the light source 152 is configured to emit light from its top surface.

As discussed above, the top surface of the first raised portion 136 may be approximately the same height as the top surface of the second raised portion 140. This configuration of the first and second leads helps reduce the amount of stress imparted on the bonding wire 156. As the bonding wire 156 is often a point of failure in PLCC packages, reducing the amount of stress imparted on the bonding wire 156 can increase the operational reliability of the PLCC package 108. In some embodiments, it may not be necessary to have the top surface of the first raised portion 136 be approximately the same height as the top surface of the second raised portion 140. Rather, it may be desirable to ensure that the top surface of the second raised portion 140 is at least higher than the bonding pad 148. By providing the second raised portion 140 at a position higher than the bonding pad 148, the wire bonding process can be simplified because less stress is imparted on the bonding wire 156 as compared to traditional PLCC packages and because the amount of wire looping required can be minimized. Furthermore, the relative heights of the first and second raised portions 136, 140, respectively, help reduce the overall height of the PLCC package 108.

As can be seen in FIGS. 3A and 3B, after the bonding wire 156 has been connected to the light source 152 and the opposite terminal (i.e., the second lead 128*b*), the lens 116 may be positioned over the top of the plastic housing 112, thereby enclosing the light source 152. The lens 116 may be configured to improve the light extraction efficiency of the PLCC package 108. The lens 116 may also shape the light as it exits the PLCC package 108 and can also improve the reliability of the PLCC package 108 by reducing the amount of moisture that reaches the lead frame cavity 144 (as well as any encapsulant provided therein).

In some embodiments, the lens 116 may be positioned above the plastic reflector cup 160. In other embodiments, a PLCC package 108 may be provided without the lens 116. Specifically, the lens 116 height can be reduced or the need for the lens 116 can be eliminated depending upon the intended use for the PLCC package 108. For example, the lead frame cavity 144 provides a first light-shaping option and the plastic reflector cup 160 provides a second light-shaping option without requiring a lens 116. If the properties of the lead frame cavity 144 and plastic reflector cup 160 are sufficient to achieve the desired light-shaping requirements, then no lens 116 may be needed and the overall height of the PLCC package 108 can be greatly reduced.

Figure 3C:
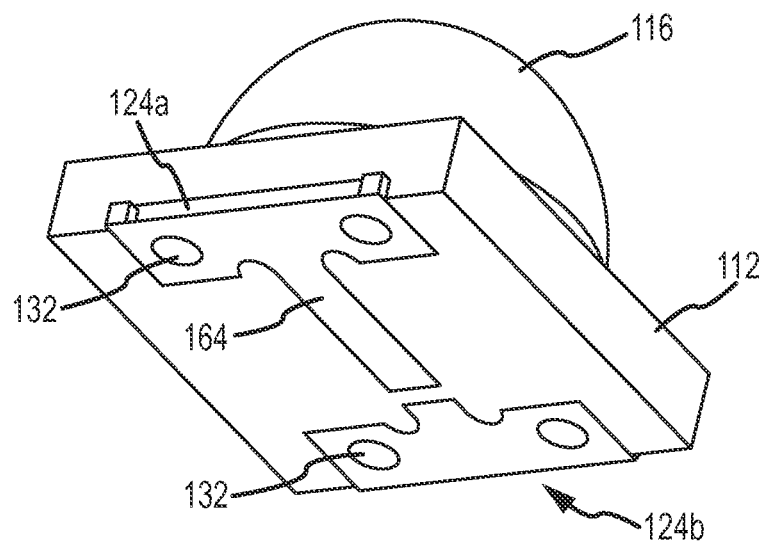
FIG. 3C is a bottom perspective view of the PLCC package depicted in FIG. 3A.
Figure 4:
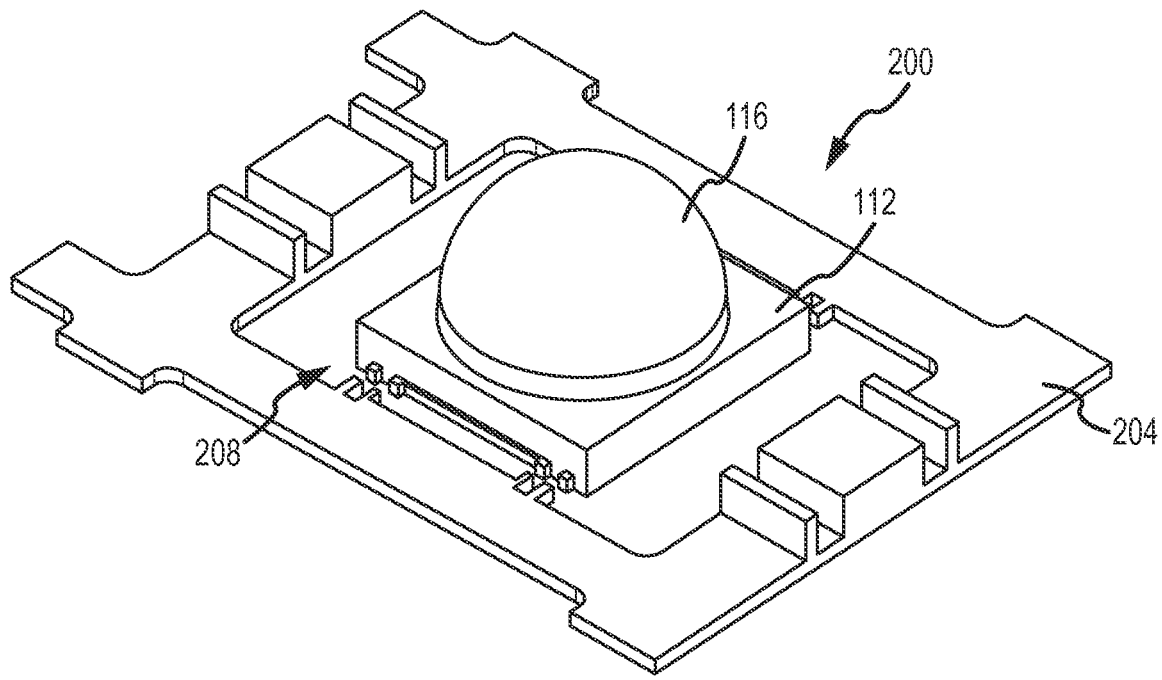
FIG. 4 is a top perspective view of a second package assembly in accordance with embodiments of the present disclosure.
Figure 5A:
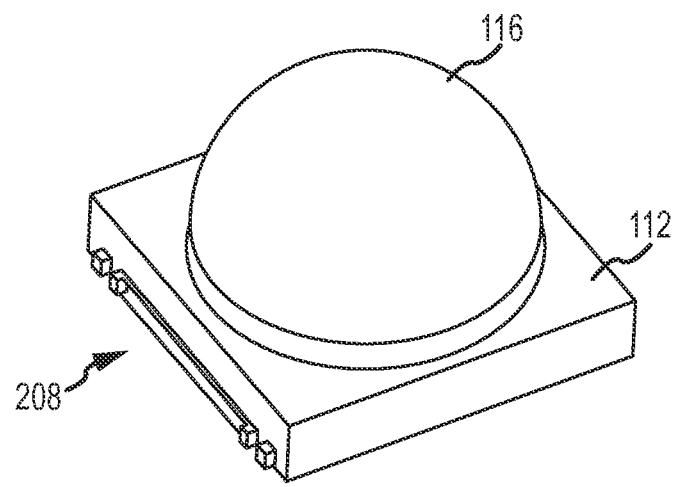
FIG. 5A is a top perspective view of a second PLCC package in accordance with embodiments of the present disclosure.
Figure 5B:
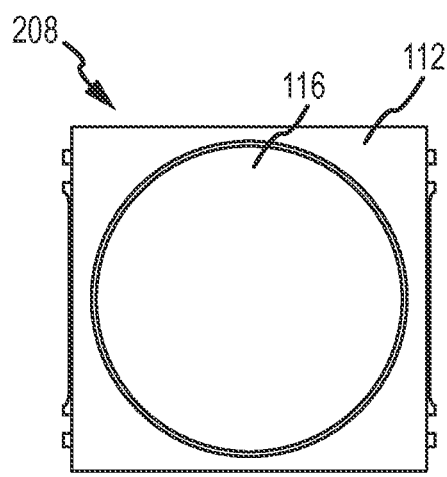
FIG. 5B is a top view of the PLCC package depicted in FIG. 5A.
Figure 5C:
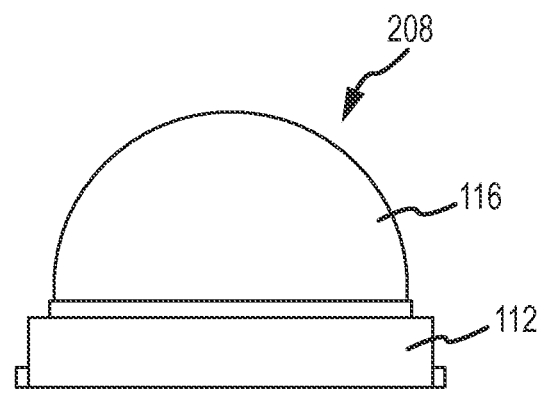
FIG. 5C is a side view of the PLCC package depicted in FIG. 5A.

FIG. 3C shows in further detail how the outer edges of the first lead 124*a* and second lead 124*b* are exposed at the opposite outside edges of the plastic housing 112. Additionally, the bottoms of the first and second leads 124*a*, 124*b* are exposed at the bottom of the plastic housing 112. This enables the PLCC package 108 to be electrically connected via bottom or side electrical connections. Furthermore, the heat sink 164 is exposed on the bottom surface of the plastic housing 112, thus providing a way for heat generated by the light source 152 to efficiently exit the PLCC package 108 (i.e., because the material used for the lead frame 120 is a more efficient conductor of thermal energy than the material used for the plastic housing 112).

With reference now to FIGS. 4-8B, a second package assembly 200 comprising a second package carrier 204 used to create a second PLCC package 208 will be described in accordance with at least some embodiments of the present disclosure. The PLCC package 208 is similar to PLCC package 108 in that both PLCC packages comprise a plastic housing 112 and each may optionally comprise an external lens 116, which is attached about or around a plastic reflector cup 160 provided on the plastic housing 112. However, where the first PLCC package 108 comprises a lead frame 120 having a first lead 124*a* and a second lead 124*b*, where one of the leads also included the integral heat sink 164 and lead frame cavity 144, the second PLCC package 208 comprises a lead frame 212 having a first lead 220*a*, a second lead 220*b*, and a separate heat sink 248.

The package carrier 204 may be similar or identical to the package carrier 104 except that the package carrier 204 is configured with three raised portions instead of two. The materials used to construct the package carrier 104 may also be used to construct the package carrier 204.

Figure 6A:
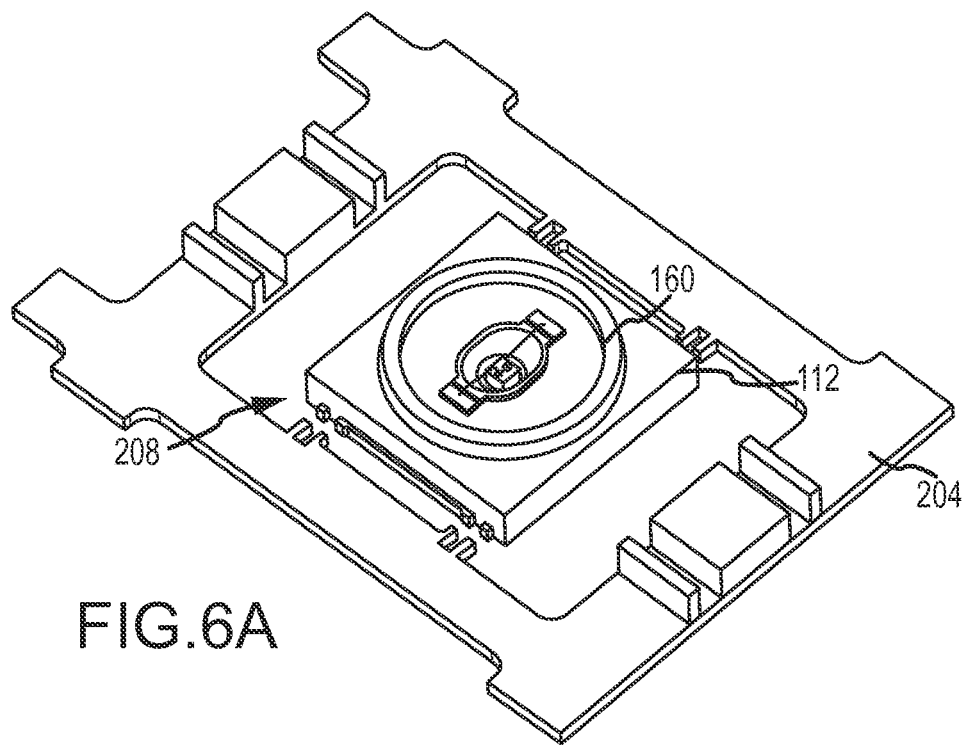
FIG. 6A is a top perspective view of a second partially-completed PLCC package relative to a package carrier in accordance with embodiments of the present disclosure.
Figure 6B:
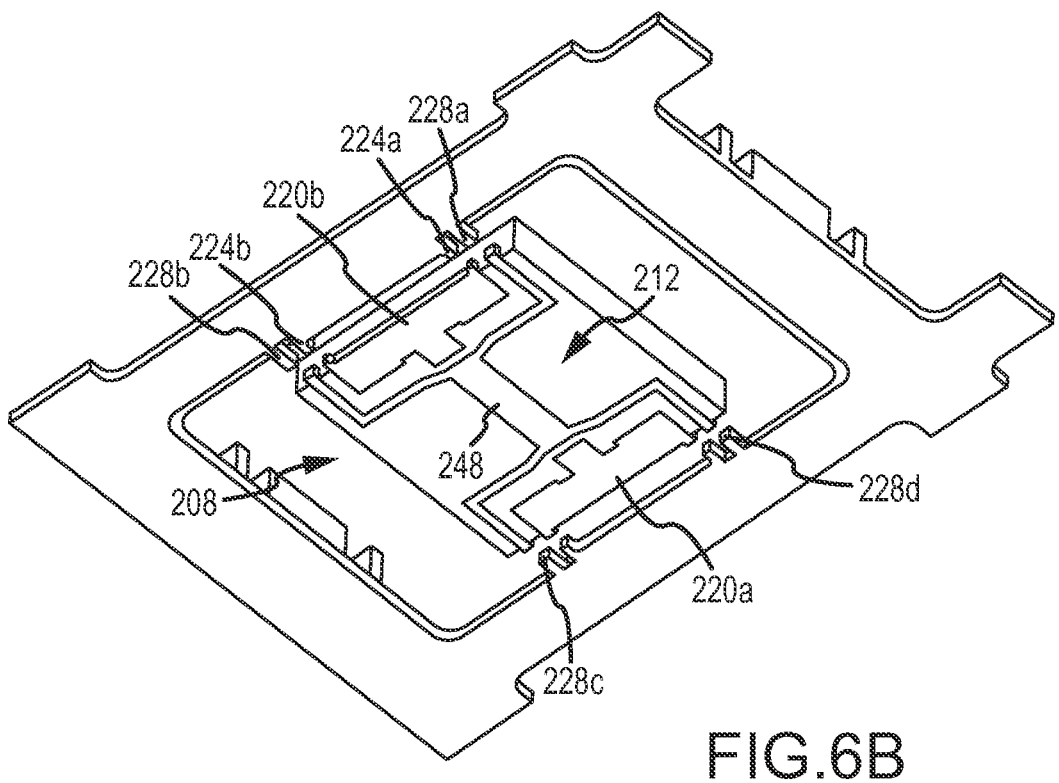
FIG. 6B is a bottom perspective view of the second partially-completed PLCC package depicted in FIG. 6A.
Figure 7B:
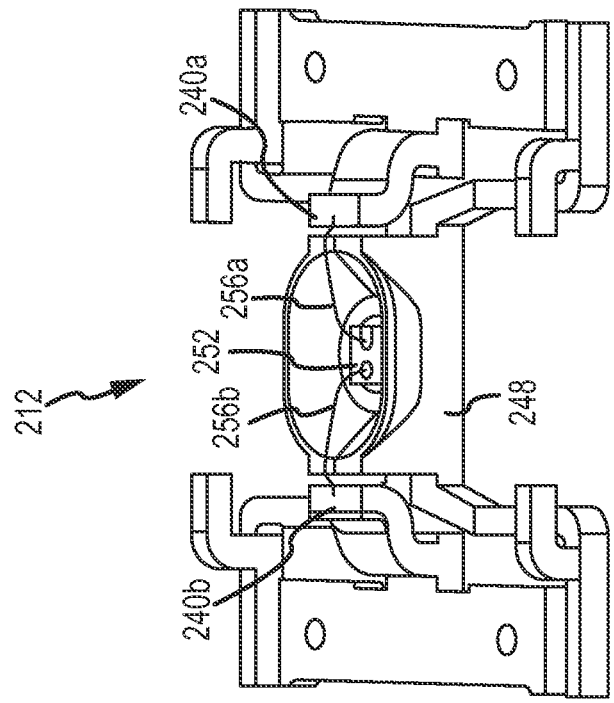
FIG. 7B is a top perspective view of the second lead frame depicted in FIG. 7A.
Figure 7A:
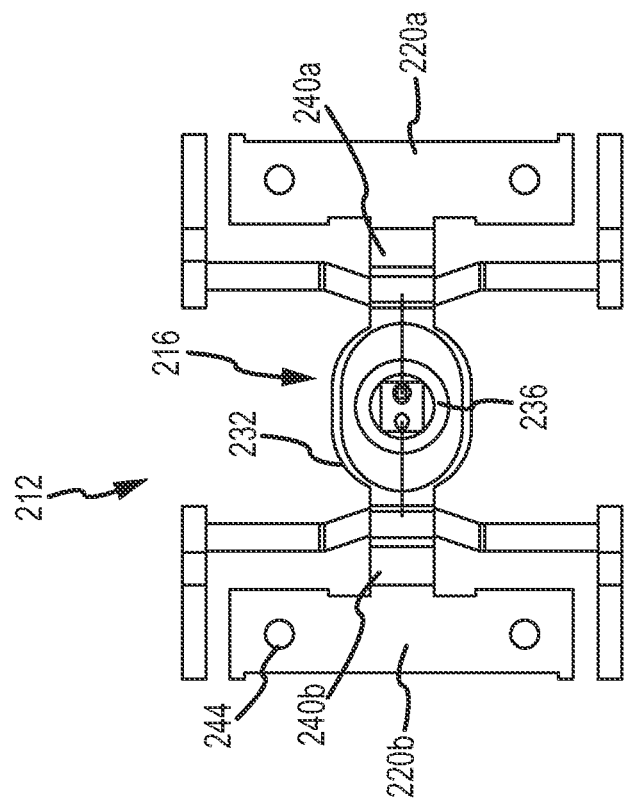
FIG. 7A is a top view of a second lead frame in accordance with embodiments of the present disclosure.

As can be seen in FIGS. 6B, 7A, and 7B, the first lead 220*a* may be electrically and physically isolated from both the second lead 220*b* and the heat sink 248. Similarly, the second lead 220*b* may be electrically and physically isolated from both the first lead 220*a* and the heat sink 248. This means that each component of the lead frame 212 comprises separate connectors for connecting to the package carrier 204 during the manufacturing process. In particular, the first lead 220*a* may comprise a first and second lead connector 224*a*, 224*b*, respectively, which connect the first lead 220*a* to the package carrier 204. Similarly, the second lead 220*b* may comprise a first and second lead connector 224*a*, 224*b*, respectively, which connect the second lead 220*b* to the package carrier 204. Much like the lead frame 120, the first and second leads 220*a*, 220*b* may be oppositely-disposed at the outer edges of the PLCC package 208.

The heat sink 248 may comprise a plurality of its own heat sink connectors 228*a*-*d*, which connect the heat sink 248 to the package carrier 204. Although two connectors 224*a*, 224*b* are depicted on each lead, a greater or lesser number of connectors may be utilized without departing from the scope of the present disclosure. Likewise, although the heat sink 248 is depicted as having four connectors, a greater or lesser number of connectors can be used without departing from the scope of the present disclosure. In some embodiments, the first and second heat sink connectors 228*a*, 228*b* extend around one lead (e.g., the second lead 220*b*) and the second and third heat sink connectors 228*c*, 228*d* extend around the other lead (e.g., the first lead 220*a*).

FIGS. 7A and 7B depict further details of the lead frame 212. One or more portions of the lead frame 212 may comprise anchorage holes 244. The anchorage holes 244 may be similar or identical to the anchorage holes 132.

The heat sink 248 may comprise a heat sink raised portion 216, the first lead 220*a* may comprise a first raised portion 240*a*, and the second lead 220*b* may comprise a second raised portion 240*b*. In some embodiments, the top surfaces of each raised portion 216, 240*a*, and 240*b* are approximately the same height.

The heat sink raised portion 216 may comprise a lead frame cavity 232 formed therein that is similar or identical to the lead frame cavity 144, except that the lead frame cavity is formed in the heat sink 248 rather than a lead. The lead frame cavity 232 may comprise a bonding pad 236 that is configured to receive a light source 252. The bonding pad 236 may be similar or identical to the bonding pad 148 except that the bonding pad 236 is not used to carry electrical current to/from the light source 252. Instead, the heat sink 248 is primarily used to shape light emitted by the light source 252 (e.g., via the lead frame cavity 232) and transfer heat generated by the light source 252 to the bottom of the PLCC package 208.

Thus, the light source 252 is configured with first and second terminals on the same upper surface of the light source 252. In some embodiments, both the cathode and anode of the light source 252 may be provided on the same upper surface of the light source 252. The cathode may be electrically connected to one of the leads (e.g., the first lead 220*a*) while the cathode may be electrically connected to the other of the leads (e.g., the second lead 220*b*).

The electrical connections of the leads 220*a*, 220*b* to the light source 252 may be achieved with first and second bonding wires 256*a*, 256*b*. The bonding wires 256*a*, 256*b* may be similar or identical to the bonding wire 156. In some embodiments, the bonding wires 156, 256*a*, 256*b* are made of an electrically conductive material such as Au, Ag, Cu, and the like. Often times the bonding wires 256a, 256b are extremely fine and are, therefore, susceptible to breaking or coming un-bonded under stresses. Accordingly, the first raised portion 240a and second raised portions 240b may be the same height as the top of the heat sink raised portion 216. It may be, however, suitable for the first and second raised portions 240a, 240b to be lower than the top of the heat sink raised portion 216 as long as they are higher than the surface of the bonding pad 236. As can be seen in FIG. 8B, it may also be suitable to position the first and second raised portions 240a, 240b above the top surface of the heat sink raised portion 216.

Another difference between the lead frame 120 and lead frame 212, is that the raised portions 240a, 240b of the first and second leads 220a, 220b may be configured on a J-bend structure. This enables the raised portions 240a, 240b to extend over the gap between the leads 220a, 220b and the heat sink 240 and be positioned closer to the light source 252. This reduces the length of bonding wire 256a, 256a required to electrically connect the light source 252 to the leads 220a, 220b.

Figure 8A:
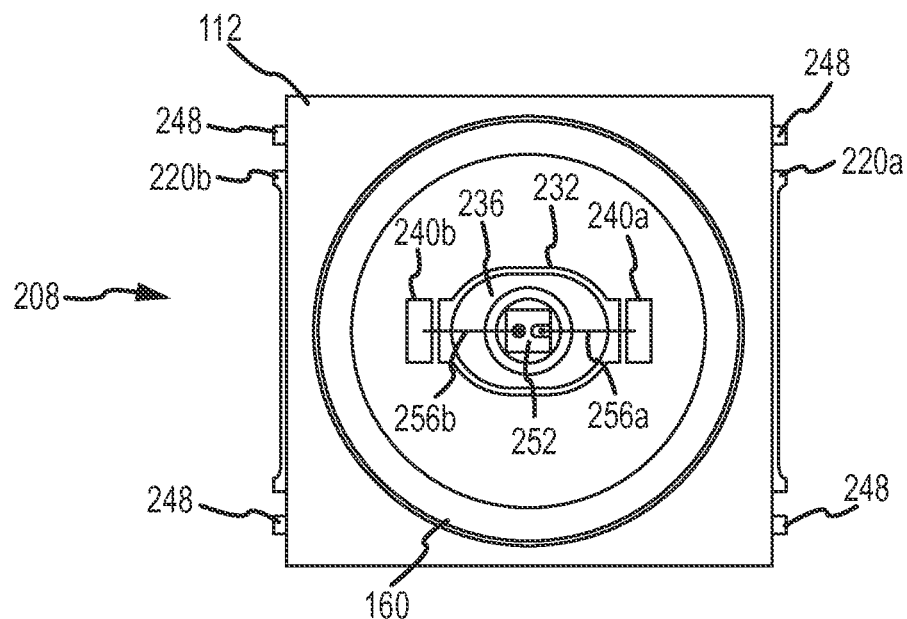
FIG. 8A is a top view of a second PLCC package in accordance with embodiments of the present disclosure.
Figure 8B:
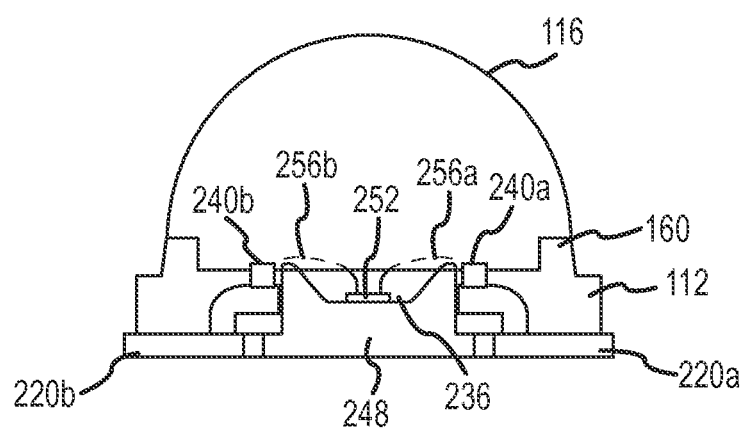
FIG. 8B is a cross-sectional side view of the second PLCC package depicted in FIG. 8A.

As can be seen in FIG. 8A, the shape of the reflector cup formed in the lead frame cavity 232 does not necessarily have to be the same as the shape of the plastic reflector cup 160, although such a configuration is possible. Rather, the reflector cup in the lead frame cavity 232 may comprise an oval or elliptical shape whereas the plastic reflector cup 160 may comprise a circular shape. Other shapes (e.g., rectangular, square, polygonal, etc.) may be used for either the reflector cup in the lead frame cavity 232 and/or plastic reflector cup 160. Similarly, different shapes can be utilized for the reflector cup in the lead frame cavity 144 and plastic reflector cup 160 of the PLCC package 108.

Figure 9:
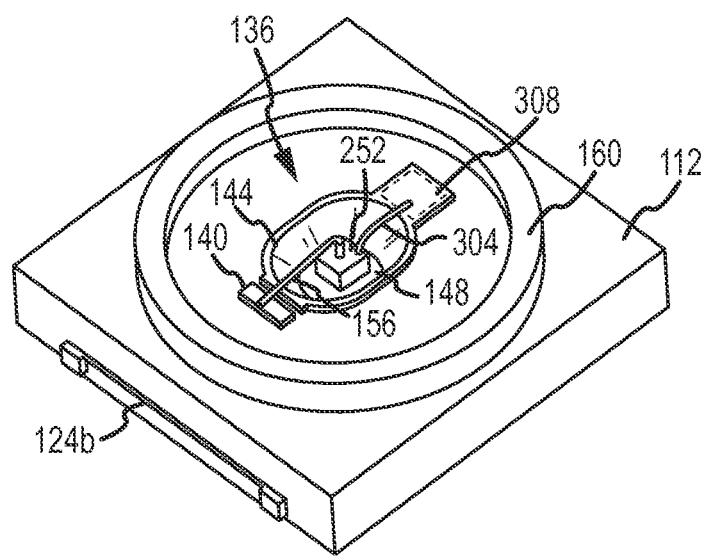
FIG. 9 is a top perspective view of a third partially-completed PLCC package in accordance with embodiments of the present disclosure.

FIG. 9 depicts yet another type of PLCC package that may be provided in accordance with embodiments of the present disclosure. More specifically, the PLCC package depicted in FIG. 9 is a hybrid of the previously depicted PLCC packages in that the light source 252 may be used in the first PLCC package 108. Here, the light source 252 comprises both an anode and cathode on its top surface. One of the anode and cathode is connected to the second raised portion 140 via bonding wire 156. The other of the anode and cathode (i.e., that which is not already connected via bonding wire 156 to the second raised portion 140) is connected to a bonding area 308 established on an upper surface of the first raised portion 136 by a second bonding wire 304. The bonding area 308 and second bonding wire 304 enable the first PLCC package 108 to accommodate a light source 252 having both an anode and cathode on a common surface.

Figure 10:
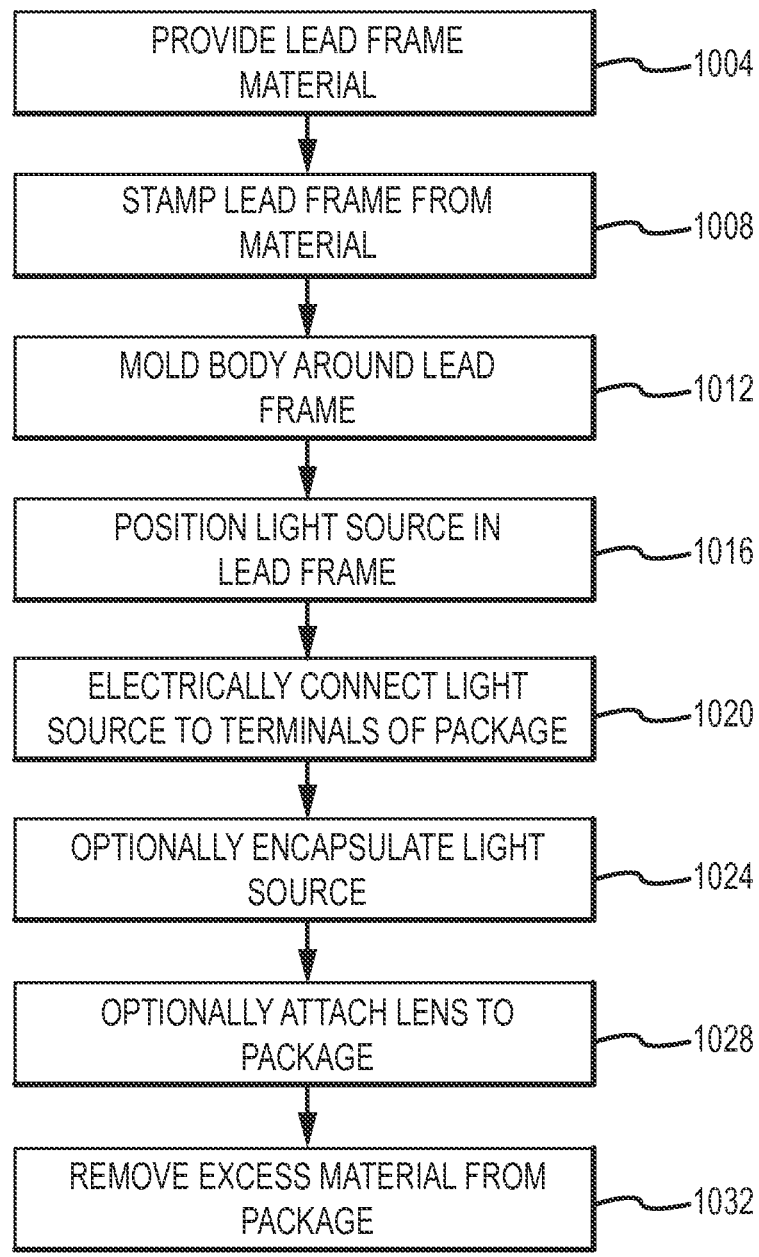
FIG. 10 is a flow diagram depicting a method of manufacturing a PLCC package in accordance with embodiments of the present disclosure.

Referring now to FIG. 10, a method of constructing a PLCC package will be described in accordance with at least some embodiments of the present disclosure. Although the steps depicted in FIG. 10 are shown in a particular order, those of ordinary skill in the LED manufacturing arts will appreciate that certain steps may be combined and/or the order of steps may be altered without departing from the scope of the present disclosure. Additionally, although a number of steps are depicted in FIG. 10, embodiments of the present disclosure greatly simplify the process of manufacturing a PLCC package. Specifically, a PLCC package can be constructed in as little as three manufacturing steps in accordance with embodiments of the present disclosure: (1) stamping the lead frame from its package carrier; (2) plating the lead frame cavity with a reflective material; and (3) molding the plastic housing around the lead frame.

Furthermore, the some or all of the steps described herein can be utilized to construct either PLCC package 108 or PLCC package 208. For simplicity and ease of understanding, the description of the method depicted in FIG. 10 will not refer to a specific PLCC package or the components thereof.

Initially, a lead frame material is provided in the form of a package carrier (step 1004). In some embodiments, the package carrier comprises one or more raised portions that will ultimately be formed into an electrical terminal and/or a lead frame cavity.

The lead frame or a plurality of lead frames can then be formed from the lead frame material (step 1008). In some embodiments, this step involves stamping the lead frame material and removing unnecessary material away from the package carrier. However, connectors between the lead frame and the package carrier are maintained to as to maintain the relative position of the components of the lead frame. The lead frame cavity may also be formed in this stamping step. During or after formation of the lead frame, a plating step may also be performed where some or the entire reflector cup in the lead frame cavity is coated with a highly reflective material.

After the lead frame has been formed, the plastic housing is formed around the lead frame (step 1012). In some embodiments, the plastic housing may be formed with an injection molding process, in which case the plastic housing may comprise a single piece of plastic. However, it may also be possible to construct the plastic housing with one, two, three, or more separate parts that are connected to one another using a bonding or fusing process or agent.

In some embodiments, the plastic housing is a single piece of plastic that has been formed by an injection molding process. Also in this step, the plastic reflector cup may be formed in the top portion of the plastic housing by using a machining, etching, and/or stamping process. The plastic reflector cup may have been formed during the injection molding process or an alternative approach would be to first form the plastic housing and then stamp or machine the top of the plastic housing until the plastic reflector cup has been formed. Different alternatives may be more desirable for different types of PLCC packages. In some embodiments, a white plastic material may be used to form some or all of the plastic housing to improve the brightness of the PLCC package. In other embodiments, a black plastic material may be used to form some or all of the plastic housing to improve the contrast of the PLCC package.

After the plastic housing has been attached to the lead frame, the method continues by mounting the light source into the bonding pad of the lead frame cavity (step 1016) and then electrically connecting the light source to one or more leads of the lead frame (step 1020). This particular step may include connecting one or more bonding wires between the light source and leads of the lead frame. Electrically connecting the light source may also be achieved by simply mounting the light source in the bonding pad since the lead frame cavity may be electrically conductive and included in one of the leads of the lead frame.

After the light source has been electrically connected to the leads of the lead frame, one or more optional steps may be performed. A first optional step involves filling at least a portion of the lead frame cavity with an encapsulant (step 1024). The encapsulant may be provided into the reflector cup of the lead frame cavity using known injection techniques. In some embodiments, the encapsulant only fills part of the lead frame cavity. In some embodiments, the entire lead frame cavity is filled with an encapsulant. In some embodiments, some or the entire cavity defined by the plastic reflector cup is also filled with an encapsulant, which may be the same or different from the encapsulant used to fill the lead frame cavity. Suitable types of encapsulants include, without limitation, epoxy, silicone, a hybrid of silicone and epoxy, phosphor, a hybrid of phosphor and silicone, an amorphous polyamide resin or fluorocarbon, glass, plastic, or combinations thereof.

The encapsulant may be provided for a number of reasons. First, the encapsulant may hermetically seal the light source and provide structural protection to the bonding wire(s). Second, the encapsulant may comprise optical properties for changing the color of light emitted by the light source before it exits the PLCC package. Third, the encapsulant may act as a lens for shaping light as it exits the PLCC package.

A second optional step involves attaching an external lens to the plastic housing (step 1028). This step may involve gluing the lens to the plastic housing. Alternatively, or in addition, this step may involve connecting the lens to the plastic housing with separate connector components. In other embodiments, a friction fit between the lens and the plastic reflector cup may be used to secure the lens to the plastic housing.

Thereafter, the method continues by removing additional excess material from the PLCC package (step 1032). Specifically, this step involves separating the PLCC package from the package carrier by severing the connections previously maintained between the lead frame and the package carrier. Separation of the PLCC package from the package carrier enables individual PLCC packages to be sold and distributed. Alternatively, the PLCC packages can be sold and distributed while connected to the package carrier and the customer can be responsible for removing the PLCC packages from the package carrier.

As can be appreciated, the PLCC packages may be manufactured individually or in a batch manufacturing process where each step described above is simultaneously performed on a plurality of PLCC packages.

A number of additional and/or alternative embodiments are envisioned, particularly for managing the optical characteristics of the PLCC packages described herein. As one example, where an external lens is utilized, the lens height could be reduced as compared to normal PLCC packages due to the optical properties provided by the lead frame cavity and plastic reflector cup.

As another example, for a white/blue LED, the lead frame cavity could be used to confine a first light-converting encapsulant (e.g., phosphor) while the plastic reflector cup could be used to confine a second encapsulant (e.g., a clear encapsulant) to achieve better light extraction efficiencies, better white light shaping (less yellow ring effect), and improve the reliability of the PLCC package by reducing the moisture allowed to reach the first light-converting encapsulant, which may be susceptible to adverse reactions to moisture.

As yet another example, for a white/blue LED, the lead frame cavity could be used to confine a first encapsulant (e.g., a clear encapsulant) while the plastic reflector cup could be used to confine a thin layer of a second light-converting encapsulant (e.g., phosphor). This second encapsulant is a remote phosphor and would not be as susceptible to negative adverse effects due to the heat produced by the light source since the remote phosphor is not in direct contact with the light source.

As still another example, for a white/blue LED using a blue LED die with near UV ray characteristics, the lead frame cavity could be coated/plated with a silver material to reduce the brightness degradation encountered as compared to the plastic reflector cup.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A Plastic Leaded Chip Carrier (PLCC) package, comprising:
    a lead frame including a first lead having a first bottom surface and including a heat sink and a lead frame cavity integrally formed therein, and a second lead having a second bottom surface;
    a plastic housing comprising a first side surface, a second side surface opposite to the first side surface, a lower surface positioned between the first and second side surfaces, an upper surface opposite to the bottom surface and an opening in the upper surface exposing the lead frame cavity;
    a first anchorage hole in the first bottom surface; and
    a second anchorage hole in the second bottom surface,
    wherein the plastic housing is at least partially formed around the lead frame such that the first bottom surface of the first lead, which extends beyond the first side surface, and the second bottom surface of the second lead, which extends from the heat sink and beyond the second side surface, are entirely exposed through the lower surface of the plastic housing, and
    wherein the first bottom surface of the first lead and the second bottom surface of the second lead are entirely exposed through the lower surface of the plastic housing.

2. The PLCC package of claim 1, further comprising a light source, wherein the lead frame cavity is formed on a raised portion of the lead frame and wherein the lead frame cavity includes a bonding pad in which the light source is mounted, and wherein the lead frame cavity further comprises a reflector cup that at least partially surrounds the bonding pad.

3. The PLCC package of claim 2, wherein the first lead is electrically connected to the light source which is bonded to the bonding pad.

4. The PLCC package of claim 3, wherein the first lead is directly connected to the heat sink.

5. The PLCC package of claim 4, wherein the heat sink comprises metal that both dissipates heat away from the light source and provides a first electrical terminal for the light source.

6. The PLCC package of claim 3, wherein the first lead is physically separated from the heat sink and wherein a bonding wire electrically connects the light source to the first lead.

7. The PLCC package of claim 6, wherein the lead frame further comprises a second lead that is electrically connected to the light source via a bonding wire and wherein the second lead is physically separated from the heat sink.

8. The PLCC package of claim 7, wherein the first lead comprises a first raised portion, wherein the second lead comprises a second raised portion, and wherein both the first and second raised portions are higher than the surface of the bonding pad.

9. The PLCC package of claim 1, wherein the plastic housing comprises a plastic reflector cup that is configured to shape light emitted from the PLCC package.

10. The PLCC package of claim 9, further comprising a first encapsulant that at least partially fills the lead frame cavity.

11. The PLCC package of claim 10, further comprising a second encapsulant that at least partially fills a cavity formed by the plastic reflector cup.

12. The PLCC package of claim 1, further comprising a lens attached to the plastic housing.

13. A lead frame configured to have a light source mounted thereto, the lead frame comprising:
- a first metal lead with a first bottom surface extending to a first side and configured to be a first electrical terminal for the light source;
- a second metal lead with a second bottom surface extending to a second side and configured to be a second electrical terminal for the light source;
- a first anchorage hole in the first bottom surface;
- a second anchorage hole in the second bottom surface; and
- a heat sink comprising a lead frame cavity that is configured to have the light source mounted therein and reflect light emitted by the light source, the heat sink being separated physically from the second metal lead and disposed between the first metal lead and the second metal lead such that the first bottom surface of the first metal lead and the second bottom surface of the second metal lead are on a same plane,
- wherein the bottom surfaces of the first metal lead and the second metal lead extend in opposite directions.

14. The lead frame of claim 13, wherein the lead frame cavity comprises a bonding pad and a reflector cup that surrounds the bonding pad and wherein the reflector cup is coated with a reflective material.

15. The lead frame of claim 13, wherein the first metal lead is directly connected to the heat sink such that the heat sink is also configured to be the first electrical terminal.

16. The lead frame of claim 13, wherein the heat sink is electrically isolated from both the first and second metal leads.

17. The lead frame of claim 13, wherein the first metal lead comprises a first raised portion and wherein the second metal lead comprises a second raise portion that is substantially the same height as the first raised portion, and wherein the first and second raised portions are configured to have at least one of the light source and a bonding wire bonded thereto.

18. A package carrier connected to the lead frame of claim 13.

19. A Plastic Leaded Chip Carrier (PLCC) package, comprising:
- a light source;
- a lead frame comprising:
    - a first lead with a first bottom surface and configured to be a first electrical terminal for the light source;
    - a first anchorage hole in the first bottom surface;
    - a second lead with a first bottom surface and configured to be a second electrical terminal for the light source;
    - a second anchorage hole in the second bottom surface; and
    - a heat sink comprising a lead frame cavity that is both optically and thermally coupled to the light source; and
- a plastic housing comprises a first side surface, a second side surface opposite to the first side surface, a lower surface positioned between the first and second side surfaces, an upper surface opposite to the lower surface, and an opening in the upper surface exposing the lead frame cavity,
- wherein the plastic housing is molded around at least a portion of the lead frame such that the heat sink is exposed entirely across the lower surface from the first side surface to the second side surface, the first lead, which extends beyond the first side surface, is at least partially exposed on the first side surface and on the lower surface, and the second lead, which extends beyond the second side surface, is at least partially exposed on the second side surface, on the lower surface and on the upper surface, and
- wherein the first bottom surface of the first lead and the second bottom surface of the second lead are entirely exposed through the lower surface of the plastic housing.

20. The PLCC package of claim 19, wherein the first lead and the heat sink are directly connected and wherein the heat sink is also electrically coupled to the light source.

* * * * *